US009923553B2

(12) United States Patent
Roy et al.

(10) Patent No.: US 9,923,553 B2
(45) Date of Patent: Mar. 20, 2018

(54) SYSTEMS AND METHODS FOR NON-VOLATILE FLIP FLOPS

(71) Applicant: FREESCALE SEMICONDUCTOR, INC., Austin, TX (US)

(72) Inventors: Anirban Roy, Austin, TX (US); Michael A. Sadd, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/212,826

(22) Filed: Jul. 18, 2016

(65) Prior Publication Data

US 2018/0019735 A1  Jan. 18, 2018

(51) Int. Cl.
| H03K 3/289 | (2006.01) |
| H03K 3/356 | (2006.01) |
| H03K 3/3562 | (2006.01) |
| G11C 13/00 | (2006.01) |
| G11C 13/02 | (2006.01) |

(52) U.S. Cl.
CPC ....... *H03K 3/35625* (2013.01); *G11C 13/004* (2013.01); *G11C 13/0023* (2013.01); *G11C 13/0069* (2013.01); *G11C 13/025* (2013.01)

(58) Field of Classification Search
CPC .. G06F 3/0688; G06F 9/52; G06F 2212/2022; G06F 2212/222; G06F 3/0604; G06F 3/0608; G06F 3/0656; G06F 3/0679; G06F 11/1469; G06F 21/79; G06F 12/0238; G06F 9/3834; G06F 9/3857; G06F 9/3861; G06F 12/0893; G06F 2212/3042; G11C 14/00; G11C 14/0081; G11C 11/4125; G11C 7/22; G11C 7/24; G11C 13/0069; G11C 2213/77; G11C 29/789; H03K 19/17744; H03K 3/356
See application file for complete search history.

(56) References Cited

U.S. PATENT DOCUMENTS

| 6,191,989 B1 | 2/2001 | Luk et al. |
| 6,816,403 B1 | 11/2004 | Brennan et al. |
| 8,027,206 B2 | 9/2011 | Yoon et al. |
| 8,159,868 B2 * | 4/2012 | Widjaja ................. G11C 11/14 365/148 |
| 8,194,439 B2 | 6/2012 | Kim et al. |
| 8,422,295 B1 | 4/2013 | Lin et al. |
| 8,509,003 B2 | 8/2013 | Lin et al. |

(Continued)

OTHER PUBLICATIONS

Chabi, D. et al., "Ultra Low Power Magnetic Flip-Flop Based on Checkpointing/Power Gating and Self-Enable Mechanisms", IEEE Transactions on Circuits and Systems I: Regular Papers, vol. 61, Issue 6, Jun. 2014, pp. 1755-1765.

(Continued)

*Primary Examiner* — Lincoln Donovan
*Assistant Examiner* — Diana J Cheng

(57) ABSTRACT

A non-volatile flip flop integrated circuit includes a master latch circuit, a slave latch circuit coupled to the master latch circuit, and a non-volatile memory array coupled to the slave latch circuit. The non-volatile memory array includes a first pair of memory cells coupled to the slave latch circuit, and a second pair of memory cells coupled to the slave latch circuit in parallel with the first pair of memory cells. The first and second pair of memory cells are configured to store data from the slave latch circuit, and to restore data to the slave latch circuit.

24 Claims, 4 Drawing Sheets

(56) References Cited

U.S. PATENT DOCUMENTS

| | | | |
|---|---|---|---|
| 8,687,412 | B2 | 4/2014 | Chih et al. |
| 2011/0122674 | A1 | 5/2011 | Lin et al. |
| 2014/0021155 | A1 | 7/2014 | Sun et al. |
| 2016/0232968 | A1* | 8/2016 | August .............. G11C 11/1693 |

OTHER PUBLICATIONS

Ikegami, K. et al., "MTJ-Based 'Normally-Off Processors' with Thermal Stability Factor Engineered Perpendicular MTJ, L2 Cache Based on 2T-2MTJ Cell, L3 and Last Level Cache Based on 1T-1MTJ Cell and Novel Error Handling Scheme", 2015 IEEE International Electron Devices Meeting (IEDM), Dec. 7-9, 2015, pp. 25.1.1-25.1.4.

Na, T. et al., "A Comparative Study of STT-MTJ Based Non-Volatile Flip-Flops", 2013 IEEE International Symposium on Circuits and Systems (ISCAS2013), May 19-23, 2013, pp. 109-112.

U.S. Appl. No. 15/163,801, Roy, A. et al., "Systems and Methods for Non-Volatile Flip Flops", filed May 25, 2016.

U.S. Appl. No. 15/018,095, Sadd, M., et al., "Resistive Non-Volatile Memory Cell and Method for Programming Same", filed Feb. 8, 2016.

Aoki, Masaki et al: "A Novel Voltage Sensing 1T/2MTJ Cell with Resistance Ratio for Highly Stable and Scalable MRAM", 2005 Symposium on VLSI Circuits Digest of Technical Papers, Jun. 16-18, 2005, IEEE, pp. 170-171.

Chen, Yiran et al: "A Nondestructive Self-Reference Scheme for Spin-Transfer Torque Random Access Memory (STT-RAM)", Design, Automation & Test in Europe Conference & Exhibition (DATE), Mar. 8-12, 2010, Dresden, IEEE, pp. 148-153.

Huang, Kejie et al: "Optimization Scheme to Minimize Reference Resistance Distribution of Spin-Transfer-Torque MRAM", IEEE Transactions on Very Large Scale Integration (VLSI) Systems, vol. 22, No. 5, May 2014, pp. 1179-1182.

Na, Taehui et al: "Reference-Scheme Study and Novel Reference Scheme for Deep Submicrometer STT-RAM", IEEE Transactions on Circuits and Systems—I: Regular Papers, vol. 61, No. 12, Dec. 2014, pp. 3376-3385.

Smullen, Clinton W.: "Designing Giga-scaleMemory Systems with STT-RAM", Presented to the Faculty of the School of Engineering and Applied Science University of Virginia, Dec. 2011, pp. 1-158.

Tsuchida Kenji et al: "A 64Mb MRAM with Clamped-Reference and Adequate-Reference Schemes", ISSCC 2010 / Session 14 / Non-Volatile Memory / 14.2, 2010 IEEE International Solid-State Circuits Conference, pp. 258-260.

Yu, Hung-Chang et al: "New Circuit Design Architecture for a 300-MHz 40nm 1Mb Embedded STT-MRAM with Great Immunity to PVT Variation", 2012 International Conference on Solid-State and Integrated Circuit (ICSIC 2012) IPCSIT vol. 32 (2011) © (2011) IACSIT Press, Singapore, pp. 57-61.

Zhang, Li et al: "Design and analysis of the reference cells for STT-MRAM", Article in IEICE Electronics Express, January 2013, Impact Factor: 0.32 • DOI: 10.1587/elex.10.20130352, IEICE Electronics Express, vol. 10, No. 12, 1-6, pp. 1-8.

Xu, Wei et al: "Design of Spin-Torque Transfer Magnetoresistive RAM and CAM/TCAM with High Sensing and Search Speed", IEEE Transactions on Very Large Scale Integration (VLSI) Systems, vol. 18, No. 1, Jan. 2010, pp. 66-74.

* cited by examiner

US 9,923,553 B2

SYSTEMS AND METHODS FOR NON-VOLATILE FLIP FLOPS

BACKGROUND

Field

This disclosure relates generally to flip flop circuits, and more specifically, to non-volatile flip flop circuits.

Related Art

In current systems, data in flip flop circuits is retained by supplying auxiliary backup or back-bias voltage to a portion of the flip-flop circuitry. Instead of consuming power to retain flip flop data, it is desirable to provide non-volatile flip flop circuitry that operates efficiently and is practical to fabricate within process, voltage and temperature variations.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

An array of non-volatile cells using programmable resistive elements is used to provide non-volatile master-slave flip flop circuitry. The array of non-volatile (NV) cells includes a number or rows, in which each row includes two NV cells, corresponding to the true data output and complementary data output of the slave latch. Each NV cell includes a programmable resistive element, which can be formed from carbon nanotubes. Compared to other programmable resistive elements, carbon nanotubes provide a greater resistance variation between a high resistive state (HRS) and a low resistive state (LRS). CNT devices also have low current requirements. Each row of NV cells stores the data corresponding to both the true and complementary outputs of the slave latch. The data in the slave latch can be stored to the NV memory cells, as needed, and restored back to the slave latch from the NV memory cells, as needed. During testing, if a row of the NV cells is found to be defective, the defective row of cells can be disabled. The use of multiple rows of NV cells for providing NV storage for each flip flop allows for boosting the read current for the restore operation and provides redundancy in the NV storage of the flip flop data.

Figure 1:
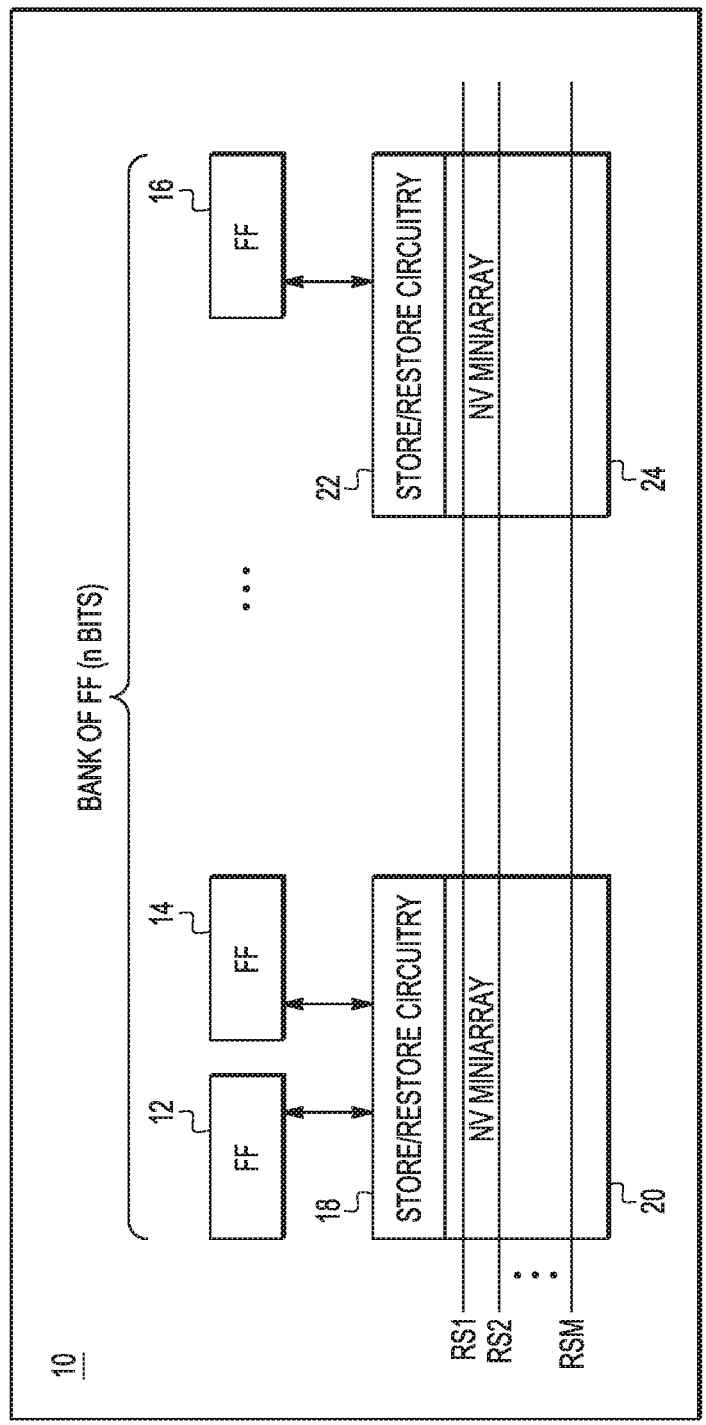
FIG. 1 is a block diagram of a non-volatile memory (NVM) flip flop system in accordance with selected embodiments of the invention.

FIG. 1 is a block diagram of a NV flip flop system 10 in accordance with selected embodiments of the invention that includes flip flops (FFs) 12, 14, and 16, and NV resistive memory cell arrays 20 and 24, and store/restore circuitry 18 and 22. Each flip flop has corresponding store/restore circuitry and an array of NV memory cells. In FIG. 1, store/restore circuitry 22 and NV array 24 corresponds to flip flop 16. Store/restore circuitry 18 and NV array 20 include store/restore circuitry and an NV array corresponding to each of flip flops 12 and 14. System 10 may include any number of flip flops, along with store/restore circuitry and an NV array for each flip flop. Each NV array for a corresponding flip flop includes an array of m rows, each including 2 NV bit cells. Therefore, each array includes 2*m NV bit cells to provide NV storage for the one flip flop. Each row is coupled to a corresponding row select (RS) line RS1-RSm. In the illustrated embodiment, the row select lines are shared among multiple NV arrays such that when a defective row is deselected, it is deselected in all NV arrays receiving the same row select lines.

Figure 2:
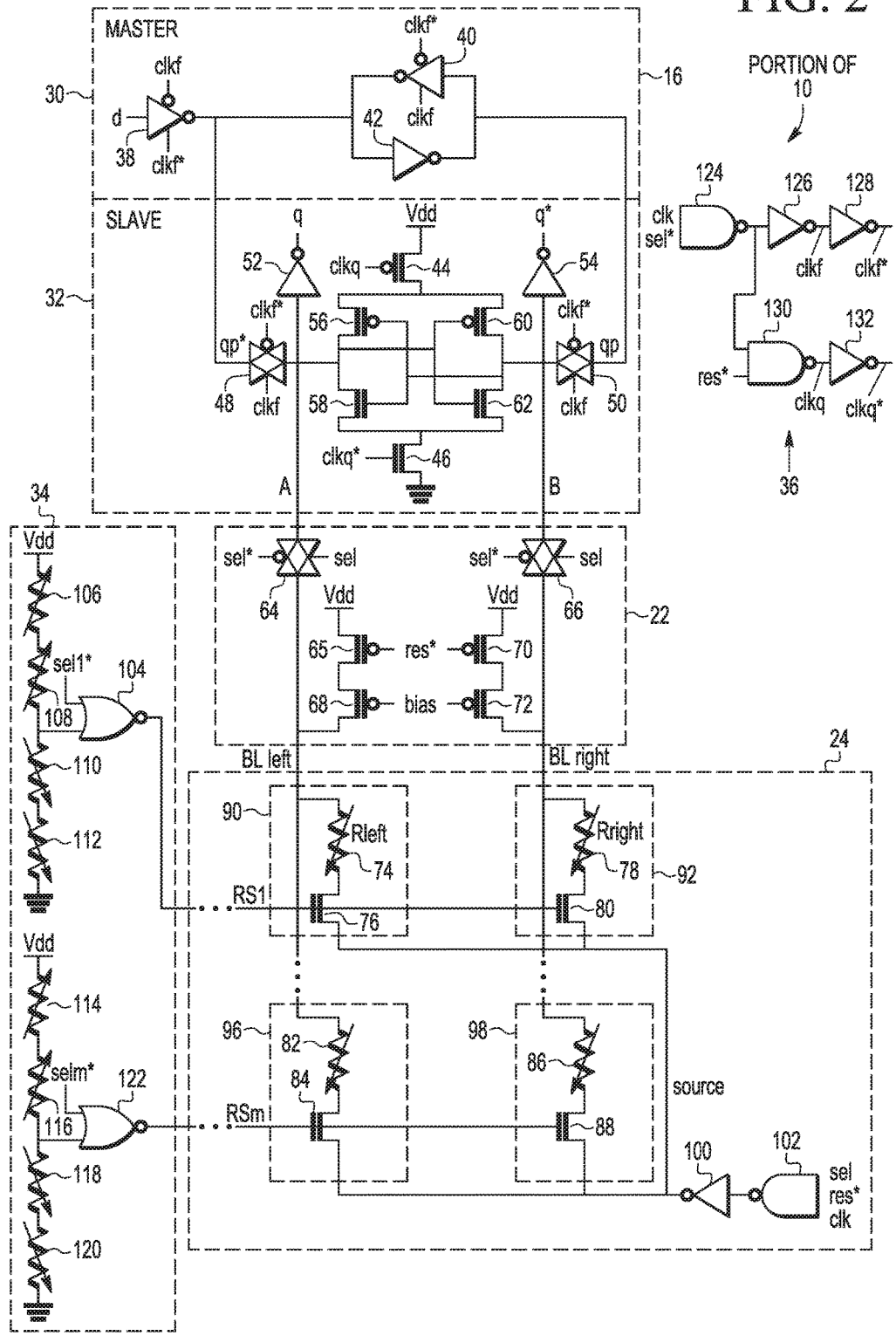
FIG. 2 is a schematic diagram of a portion of a flip flop array and array of NVM bit cells that can be used in the NVM flip flop system of FIG. 1.

FIG. 2 is a schematic diagram of a portion of FF 16, store/restore circuitry 22, and NV array 24 of FIG. 1. Also included in FIG. 2 is clock control circuitry 36 (also referred to as clock circuitry) and RS line setting circuitry 34. FF 16 includes a master portion 30 and a slave portion 32. A select signal, sel, and an inverse of the select signal, sel*, a restore signal, res, and an inverse of the restore signal, res*, are provided to the circuitry of FIG. 2. Clock control circuitry 36 receives a system clock, clk, and generates clock signals, clkf, clkf* (which is the inverse of clkf), clkq, and clkq* (which is the inverse of clkq). Clock control circuitry 36 includes NAND gates 124 and 130 and inverters 126, 128, and 132. NAND gate 124 receives clk at a first input and sel* at a second input. An output of NAND gate 124 is coupled to an input of inverter 126 and a first input of NAND gate 130. A second input of NAND gate 130 is coupled to receive res*. An output of NAND gate 130 provides clkq and is coupled to an input of inverter 132, and an output of inverter 132 provides clkq*. An output of inverter 126 provides clkf and is coupled to an input of inverter 128. An output of inverter 128 provides clkf*. Note that clkf* is an inverse of clkf, and clkq* is an inverse of clkq.

FF 16 includes a master portion 30 and a slave portion 32. Master portion 30 includes inverters 38, 40, and 42. An input of inverter 38 is coupled to receive the data input, d, of FF 16. An enable input of tri-state inverter 38 receives clkf* and an inverting enable input receives clkf. An output of tri-state inverter 40 is coupled to an input of inverter 42, and an output of tri-state inverter 38. An output of inverter 42 is coupled to an input of tri-state inverter 40. Enable inputs of tri-state inverter 40 receives clkf and inverting enable inputs receive clkf*. Note that tri-state inverter 40 and inverter 42 may be referred to as a master latch.

Slave portion 32 includes transmission gates 48 and 50, inverters 52 and 54, P-channel transistors 44, 56, and 60, and N-channel transistors 58, 62, and 46. An output of tri-state inverter 38 is coupled to a first terminal of transmission gate 48 and a second terminal of transmission gate 38 is coupled to an input of inverter 52. The first terminal of transmission gate 48 receives the complementary input from the master latch, qp*. An enable input of transmission gate 48 receives clkf, and an inverting enable input receives clkf*. An output of inverter 42 is coupled to a first terminal of transmission gate 50 and a second terminal of transmission gate 50 is coupled to an input of inverter 54. The first terminal of transmission gate 50 receives the true input from the master latch, qp. An enable input of transmission gate 50 receives clkf, and an inverting enable input receives clkf*. A first current electrode of transistor 44 is coupled to a first voltage supply node, such as Vdd. A control electrode of transistors 44 is coupled to receive clkq. A first current electrode of transistor 56 and a first current electrode of transistors 60 is coupled to a second current electrode of transistor 44. A second current electrode of transistors 56 is coupled to a first current electrode of transistor 58 and control electrodes of transistors 60 and 62. A second current electrode of transistor 60 is coupled to a first current electrode of transistor 62 and to control electrodes of transistors 56 and 58. A second current electrode of transistors 58 and 62 are coupled to a first current electrode of transistor 46. A control electrode of transistor 46 is coupled to receive clkq*, and second current electrode is coupled to a second voltage supply node, such as ground. Note that transistors 56, 58, 60, and 62 form two inverters coupled to form a latch and may be referred to as a slave latch. The input of inverter 52 and the second terminal of transmission gate 48 may be referred to as a circuit node A, and the input of inverter 54 and the second terminal of transmission gate 50 may be referred to as a circuit node B.

Store/restore circuitry 22 includes transmission gates 64 and 66, and P-channel transistors 65, 68, 70, and 72. A first terminal of transmission gate 64 is coupled to the input of inverter 52 at node A. A first terminal of transmission gate 66 is coupled to the input of inverter 54 at node B. A second terminal of transmission gate 64 is coupled to a bit line, BLleft, of NV array 24, and a second terminal of transmission gate 66 is coupled to another bit line, BLright, of NV array 24. A first current electrode of transistors 65 and 70 are coupled to the first voltage supply node. A first current electrode of transistor 68 is coupled to a second current electrode of transistor 65, a second current electrode of transistor 68 is coupled to BLleft of array 24, and a control electrode of transistors 68 is coupled to receive a bias voltage. A first current electrode of transistor 72 is coupled to a second current electrode of transistor 70, a second current electrode of transistor 72 is coupled to BLright of array 24, and a control electrode of transistor 72 is coupled to receive the bias voltage.

NV array 24 includes m rows of 2 NV bit cells each. (Note that NV bit cells may also be referred to as NV memory cells.) Row 1 includes a pair of NV bit cells, NV bit cell 90 and NV bit cell 92, and row m includes a pair of NV bit cells, NV bit cell 96 and NV bit cell 98. These pairs of NV bit cells are coupled in parallel to one another. Bit cell 90 is coupled to RS1 and BLleft, bit cell 96 is coupled to RSm and BL left, bit cell 92 is coupled to BLright and RS1, and bit cell 98 is coupled to BLright and RSm. Bit cell 90 includes a programmable resistive element 74 and an N-channel transistor 76 (also referred to as an access transistor or pass transistor) in which a first terminal of programmable resistive element 74 is coupled to BLleft, a first current electrode of transistor 76 is coupled to a second terminal of programmable resistive element 74, and a control electrode of transistor 76 is coupled to RS1. Bit cell 92 includes a programmable resistive element 78 and an N-channel transistor 80 (also referred to as an access transistor or pass transistor) in which a first terminal of programmable resistive element 78 is coupled to BLright, a first current electrode of transistor 80 is coupled to a second terminal of programmable resistive element 78, and a control electrode of transistor 80 is coupled to RS1. Bit cell 96 includes a programmable resistive element 82 and an N-channel transistor 84 (also referred to as an access transistor or pass transistor) in which a first terminal of programmable resistive element 82 is coupled to BLleft, a first current electrode of transistor 84 is coupled to a second terminal of programmable resistive element 82, and a control electrode of transistor 84 is coupled to RSm. Bit cell 98 includes a programmable resistive element 86 and an N-channel transistor 88 (also referred to as an access transistor or pass transistor) in which a first terminal of programmable resistive element 86 is coupled to BLright, a first current electrode of transistor 88 is coupled to a second terminal of programmable resistive element 86, and a control electrode of transistor 88 is coupled to RSm. A second current electrode of the access transistors of the bit cells, such as transistor 76, 80, 84, and 88, are coupled to an output of an inverter 100. An input of inverter 100 is coupled to an output of a NAND gate 102 which receives sel at a first input, res* at a second input, and clk at a third input.

Row select setting circuitry 34 provides an enable output to each row select line, RS1-RSm, based on a per row select signal, sel1*-selm*, and programmable resistors. (Note that sel1*-selm* are active low signals and are inverses of sel1-selm, respectively.) If the row select line is a logic level high, the corresponding row is enabled and if the row select line is a logic level low, the corresponding row is disabled. The row setting circuitry for RS1 includes programmable resistors 106, 108, 110, and 112 coupled in series between the first voltage supply node and the second voltage supply node and a NOR gate 104 having a first input which receives sel1* and a second input coupled to the node between resistors 108 and 110. An output of NOR gate 104 provides RS1. Similarly, the row setting circuitry for RSm includes programmable resistors 114, 116, 118, and 120 coupled in series between the first voltage supply node and the second voltage supply node and a NOR gate 122 having a first input which receives selm* and a second input coupled to the node between resistors 116 and 118. An output of NOR gate 122 provides RSm. Each row select line may therefore have similar row setting circuitry. When a store or restore operation is occurring, one of sel1*-selm*, corresponding to the selected row, is asserted to a logic level low. Therefore, the output of the NOR gate, when the corresponding sel1*-selm* is a logic level low, is based on the settings of the resistors in series. Note that sel* is equivalent to a logical ANDing of each of sel*-selm*, and therefore, as will be discussed further below, during a store or restore operation, sel* is a logic level low (and sel is a logic level high).

The programmable resistors of circuitry 34 for each row can be programmed, as needed, to cause the output of the corresponding NOR gate to be a logic level high or low. In one embodiment, at test time, each row of NV bit cells can be tested, and if any row is determined to be defective, the resistors of the corresponding row setting circuitry can be programmed such that, when sel is high, the output of the NOR gate, and thus the corresponding row select line, is low. The row select line being low disables the corresponding row of NV bit cells. For example, referring to programmable resistors 106, 108, 110, and 112 for RS1, if row 1 is found to be good and not defective, resistors 108 and 106 can be programmed to a high resistance and resistors 110 and 112 to a low resistance. That is, resistors 106 and 108 have an opposite polarity to resistors 110 and 112. This results in enabling row 1 (with RS1 being high) when sel1* is low. If, however, row 1 is found to be defective, resistors 106 and 108 can be programmed to a low resistance and resistors 110 and 112 to a high resistance. This results in disabling row 1 (with RS1 being low) when sel1* is low. The error rate is generally low for the NV bit cells, meaning that ideally, at most only one row of rows 1-m will be disabled.

Figure 3:
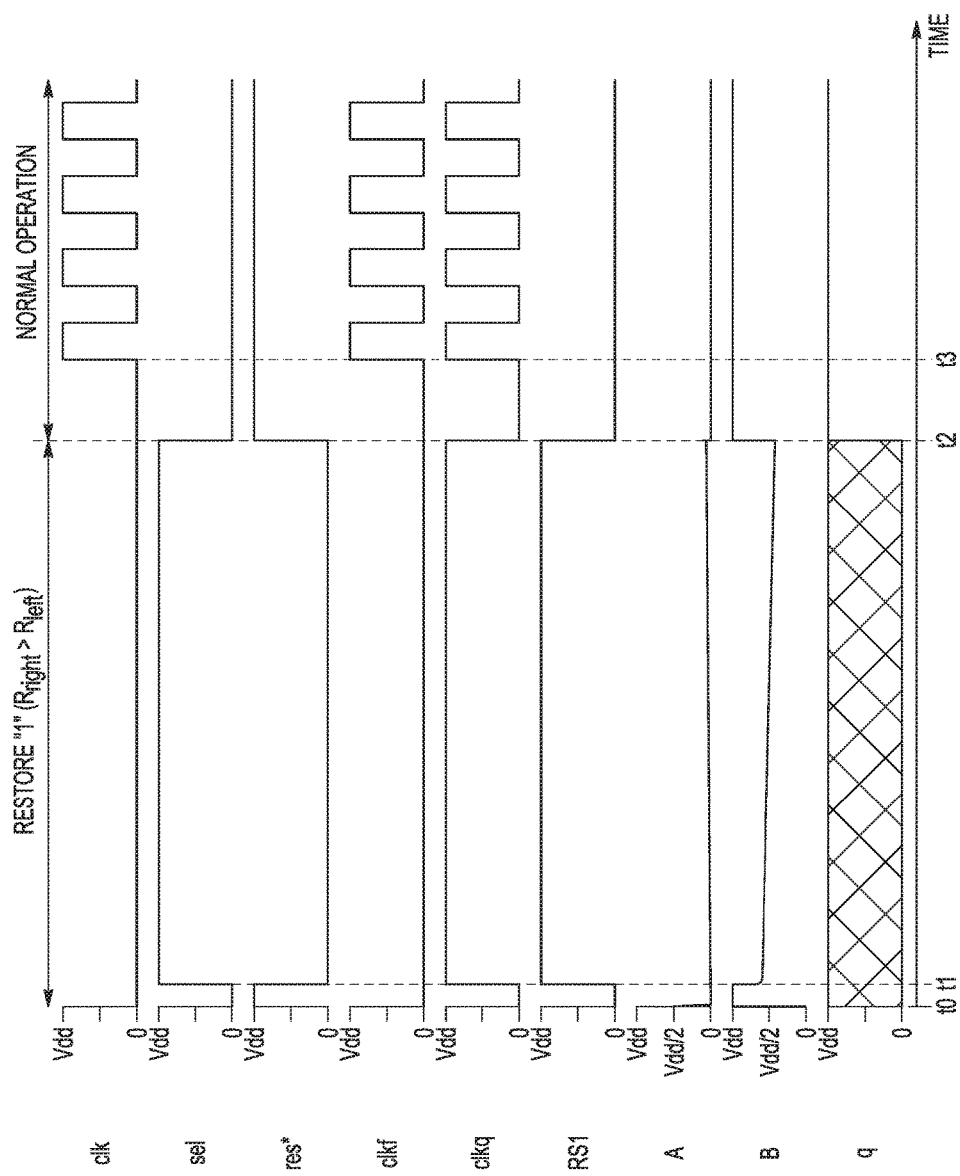
FIGS. 3 and 4 are timing diagrams showing examples of store and restore operations, respectively, for the NVM flip flop system of FIG. 1.
Figure 4:
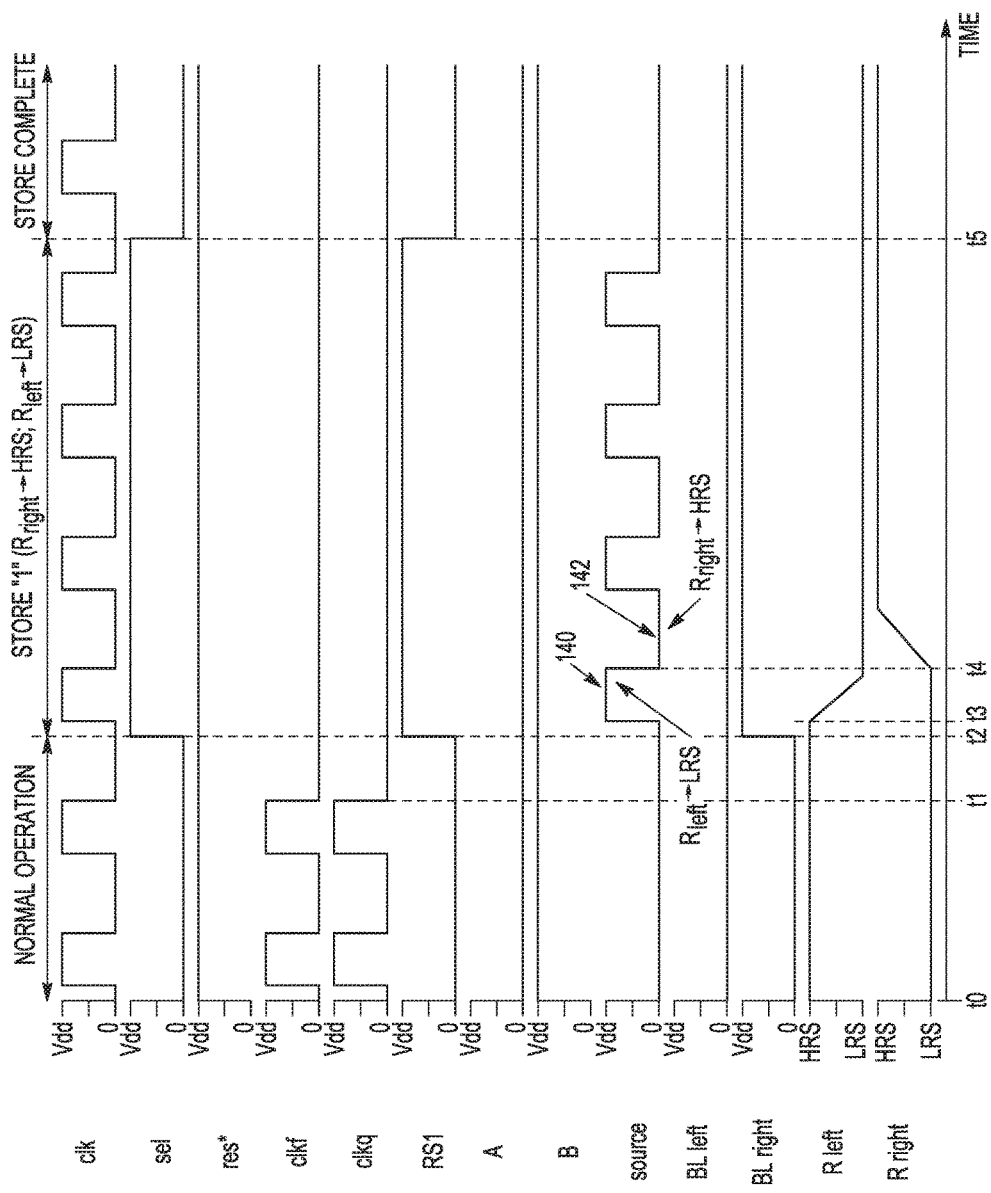

Operation of FIG. 2 will be described in reference to the timing diagrams of FIGS. 3 and 4. FIG. 3 illustrates a restore operation in accordance with one embodiment of the present invention, and FIG. 4 illustrates a store operation in accordance with one embodiment of the present invention. As discussed above, a store operation from flip flop 16 to NV array 24 can be performed anytime there is a need to store the data of the flip flop in NV storage so the data can be maintained, such as for reduced power operation or a power down. A restore operation can be performed to restore the previously stored value from NV array 24 to flip flop 16. In this manner, there can be provided a flip flop with NV storage capabilities. In the illustrated embodiment, each NV bit cell is implemented with a programmable resistive element which may be, for example, a carbon nanotube resistive element. When a sufficient current is provided in a first direction through the resistive element, the resistive element is programmed to a HRS (for example, 1 MOhm), and when a sufficient current is provided in a second and opposite direction through the resistive element, the resistive element is programmed to a LRS (for example, 200 KOhms). In the illustrated embodiment, it is assumed that a HRS corresponds to a logic level 1 and a LRS to a logic level 0. To read a state of the NV cell, a current is provided through the resistive elements (but not a current sufficient to change the state of the resistive element) resulting in a voltage drop over the resistive element. This voltage drop may then be sensed to determine the state.

Referring first to FIG. 2 in which flip flop 16 is operating normally, sel is a logic level low and res* is also a logic level high. This turns off transmission gates 64 and 66, thus decoupling store/restore circuitry 22 and array 24 from flip flop 16. Also, the second input to logic gate 124 is a logic level one and the second input of logic gate 130 is a logic level one. Therefore, clkf=clkq, and flip flop 16 operates as a master slave flip flop, as known in art. During a first phase of the clock, data at data input d gets stored in the master latch and during the second phase of the clock, the data in the master latch gets transferred to the slave latch, which outputs the data as q or q* (the inverse of q). In the illustrated embodiment, the output of inverter 52 provides q and the output of inverter 54 provides q*.

Referring to FIGS. 2 and 3, it is assumed that each row in NV array 24 stores a logic level 1, which is the value that was previously stored from the slave latch of flip flop 16. In this case, each programmable resistive element of array 24 coupled to BLleft was previously programmed during a store operation to a LRS and each programmable resistive element of array 24 coupled to BLright was previously programmed during the store operation to a HRS. Note that at this time, the programmable resistors of row setting circuitry 34 have be previously programmed to the desired state to enable or disable the corresponding row select line.

At time t0, it is assumed that system 10 is in a low power state. Therefore, at this time, clk, clkq, and clkf are off, and in a low state, sel is low and res* is high. The output of flip flop q is an indeterminate state. A restore operation begins at time t1, in which sel is set to a logic level high and res* to a logic level 0. Also, clkq goes high due to NAND gate 130 and turns off transistors 44 and 46 in slave portion 32 With sel set high, the NOR gates of row select setting circuitry 34 enables or disables each row select line of array 24 accordingly. In the example of FIG. 3, the value of RS1 is provided. However, the value of any enabled row select line of array 24 would match the values of RS1. Since RS 1 is enabled, it is a logic level high.

During the restore, the bias voltage is first applied to the control electrodes of transistors 68 and 72. Also, transmission gates 48 and 50 are off, tri-state inverter 40 is disabled, and transmission gates 64 and 66 are high such that node A communicates with BLleft and node B with BLright. Transistors 65 and 70 are turned on and the second current electrodes (the source terminals in this case) of transistors 76 and 80 are coupled to ground (i.e. set to 0). As a result of the bias voltage, transistors 68 and 72 provide known currents down through resistive elements 74 and 78, respectively. The current through programmable resistive element 74 results in a voltage drop, and the current through programmable resistive element 78 results in a voltage drop. Since in the current example, resistive element 78 is in a HRS and resistive element 74 in a LRS, the voltage drop over resistive element 78 is higher. The voltage drop over resistive element 74, via transmission gate 64, appears on node A of the slave latch, and the voltage drop over resistive element 78 (which is programmed to the opposite state of resistive element 74) appears, via transmission gate 66, at node B of the slave latch.

In NV array 24, there are multiple rows (the enabled rows of row 1-row m) coupled to BLleft and BLright. In this example, the programmable resistive element of each row that is coupled to BLright is in a HRS, and the programmable resistive element of each row that is coupled to BLleft is in a LRS. Therefore, all of these receive the current from transistors 72 and 68, respectively, and all result in a corresponding voltage drop. Thus, the restore is performed in parallel by all the enabled row lines. The AND configuration of all the NV cells along each bit line allows for boosting the current for the restore operation. From time t1 to time t2, while the bias voltage is being applied, nodes A and B are being placed at their appropriate levels by all enabled rows of array 24. Node A, which started at Vdd/2 at time t0, is pulled to close to 0V and node B, which started at Vdd at time t0, is pulled to Vdd/2. Therefore, at time t2, sel is set to a logic level low and res* to a logic level high which turns off transistors 66 and 70 and transmission gates 64 and 66. At this point, nodes A and B are set as needed to complete the restore operation, and thus the values at nodes A and B get latched into the slave latch of flip flop 16. This restores the state of flip flop 16 and the output q is set to a logic level high again. Normal operation then commences. At time t3, clk is again enabled, such that clk, clkf, and clkq operate normally for flip flop 16, in which clkf=clkq.

Referring to FIG. 4, a store operation is performed in which a logic level one is stored in flip flop 16 at the time of the store operation. At time t0 to time t1, flip flop 16 operates normally in which clkf=clkq, sel is a logic level low, and res* is a logic level high, as was discussed above in reference to FIG. 3. At time t1, clkf and clkq are disabled and thus placed at a logic level low, but clk remains enabled. At time t2, after clkf and clkq are disabled, thus disabling the master latch and turning off transmission gates 48 and 50, the store operation commences.

The store operation is performed serially for each row of NV array 24. This helps minimize the write current being supplied by the slave latch of flip flop 16. The example of FIG. 4 is performing a store operation to row 1. During the store, transistors 44 and 46 are turned on by clkq, sel and res* are high, and the enabled row select line for the current row, RS1, goes high. Also, during the store, transmission gates 64 and 66 are turned on, thus communicating nodes A and B with BLleft and BLright, respectively. Since in the current example flip flop 16 was storing a logic level one, node A, and thus BLleft, is at a logic level low and node B, and thus BLright, is at a logic level high.

To use the values at nodes A and B to program the programmable resistive elements of array 24, the second current electrodes (the source terminals) of the access transistors along the current row are pulsed between a logic level high and logic level low to run current in the appropriate directions through the programmable resistive elements. For example, at time t3, the clk signal causes the output of inverter 100 to be a logic level high, thus setting the second current electrodes (i.e. source terminals) of transistors 76 and 80 to Vdd. Since node A is a logic level 0, this results in current flowing up through programmable resistive element 74 coupled to BLleft, thus programming it to a LRS. Since node B is a logic level 1, no or little current flows up through programmable resistive element 78 coupled to BLright. At time t4, clk goes low which causes the output of inverter 100 to be a logic level low, thus setting the second current electrodes of transistors 76 and 80 to ground. Since node B is a logic level 1, this results in current flow down through programmable resistive element 78 coupled to BLright, thus programming it to a HRS. Since node A is a logic level 0, no or little current flows down through programmable resistive element 74 coupled to BLleft.

As illustrated in the example of FIG. 4, after a single pulse of the source terminals for achieving each resistive state (such as pulse 140 for achieving the LRS and pulse 142 for achieving the HRS), resistive elements 74 and 78 are correctly placed in their desired respective states. Programmable resistive element 74 is set to the LRS before time t4, and programmable resistive element 78 is set to HRS before time t5. However, multiple pulses are illustrated, and in some embodiments, multiple pulses are needed to fully program the resistive elements of a selected row. After a predetermined number of pulses for each state (which can be one or more pulses), the store operation for the current row is complete. Therefore, in the illustrated embodiment, at time t5, the store operation for RS1 is complete, and sel and RS1 are set low again.

After the store operation for row 1 is complete, a store operation is performed for each remaining enabled row select line of NV array 24. The store operations can be performed in the same manner as was described for row 1. After a store operation has been performed for all enabled row select lines, the store operation is complete and the logic state of flip flop 16 has been transferred to each row of NV array 24. At this point, power can be safely reduced or removed, since the state of flip flop 16 is saved in NV array 24.

By now, it can be appreciated how an array of NV bit cells can be used to provide NV storage for each flip flop within a data processing system. By using carbon nanotubes for the programmable resistive elements, a greater resistance variation can be achieve between a HRS and a LRS. CNT devices also have low current requirements, thus minimizing power for the NV storage. The use of multiple rows of NV bit cells to backup each flip flop allows for a boost in the read current for the restore operation and provides redundancy in the NV storage. Also, through this use of multiple rows, a defective row can be disabled without losing functionality.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are embodiments of the present invention.

In one embodiment, a non-volatile flip-flop integrated circuit includes a master latch; a slave latch coupled to the master latch and configured to store a copy of data in the master latch; a first pair of non-volatile memory cells coupled to the slave latch; a second pair of non-volatile memory cell coupled to the slave latch and the first pair of non-volatile memory cells; and store/restore circuitry, coupled to first and second bit lines between the slave latch and the first and second pairs of non-volatile memory cells, and configured to couple the first and second pairs of memory cells to the slave latch circuit to store data from the slave latch to the first and second pairs of non-volatile memory cells, and to restore data from the first and second pairs of non-volatile memory cells to the slave latch. In one aspect of the above embodiment, the integrated circuitry further includes a first row select line coupled to a control gate of a pass transistor in each of the first pair of non-volatile memory cells; a second row select line coupled to a control gate of a pass transistor in each of the second pair of non-volatile memory cells. In another aspect, the first and second pair of non-volatile memory cells include carbon nanotube elements configured to store the data from the slave latch. In another aspect, the integrated circuitry further includes a source circuit coupled to a source electrode of an N-channel pass transistor in each of the first and second pairs of non-volatile memory cells, wherein an output of the source circuit is high when a select signal is asserted, a restore signal is not asserted, and a clock signal is high. In a further aspect, the first and second pairs of non-volatile memory cells are coupled in parallel to one another. In yet a further aspect, each non-volatile memory cell in the first and second pairs of non-volatile memory cells includes a non-volatile programmable storage element with a first terminal coupled to the first bit line and a second terminal coupled to a drain electrode of the N-channel pass transistor. In another aspect, the store/restore circuitry includes a first transmission gate including a first terminal coupled to a first data node of the slave latch and a second terminal coupled to the first bit line; a first P-channel transistor including a source electrode coupled to a supply voltage, a drain electrode, and a control gate coupled to a complement of a restore signal; a second P-channel transistor including a source electrode coupled to the drain electrode of the first P-channel transistor, a drain electrode coupled to the first bit line, and a control gate coupled to a bias signal; a second transmission gate including a first terminal coupled to a second data node of the slave latch and a second terminal coupled to the second bit line; a third P-channel transistor including a source electrode coupled to the supply voltage, a drain electrode, and a control gate coupled to a complement of a restore signal; a fourth P-channel transistor including a source electrode coupled to the drain electrode of the third P-channel transistor, a drain electrode coupled to the second bit line, and a control gate coupled to the bias signal. In a further aspect, the integrated circuitry further includes row select circuitry coupled to the first and second row select lines, the row select circuitry including: a first set of resistive elements coupled in series between a first supply voltage and a second supply voltage, a first logic gate including a first input coupled between a first and second of the first set of resistive elements, a second input coupled to a complement of a select signal, and an output coupled to the first row select line; a second set of resistive elements coupled in series between the first supply voltage and the second supply voltage, a second logic gate including a first input coupled between a first and second of the second set of resistive elements, a second input coupled to a complement of a select signal, and an output coupled to the second row select line. In yet another aspect of the above embodiment, the integrated circuitry further includes clock circuitry configured to generate first and second clock signals, wherein the first and second clock signals alternate between first and second values during normal operation when the slave latch stores data from the master latch, and the first clock signal is at a constant first value and the second clock signal is at a constant second value when data from the first or second pair of non-volatile memory cells is restored to the slave latch. In a further aspect, the integrated circuitry further includes row select circuitry including a first set of resistive elements coupled in series, and a second set of resistive elements coupled in series with opposite polarity as the first set of resistor elements; and a logic gate including a first input coupled between the first and second sets of resistive elements and an output coupled to the first row select line.

In another embodiment, a method of operating a slave latch circuit coupled to a master latch and non-volatile memory includes during normal operation: copying data from the master latch to the slave latch; during a restore operation: coupling first and second pairs of non-volatile memory cells to the slave latch circuit; transferring data from the first and second pairs of non-volatile memory cells to the slave latch circuit, wherein the first and second pairs of non-volatile memory cells are coupled in parallel with one another; decoupling the first and second pairs of non-volatile memory cells from the slave latch circuit after the data is transferred from the first and second pairs of non-volatile memory cells to the slave latch circuit; during a store operation: coupling the first and second pairs of non-volatile memory cells to the slave latch circuit; transferring data from the slave latch to the first and second pairs of non-volatile memory cells; decoupling the first and second pairs of non-volatile memory cells from the slave latch circuit after the data is transferred from the latch circuit to the first and second pairs of non-volatile memory cells. In one aspect of the above another embodiment, the method further includes generating a first clock signal for the slave latch circuit that is a first constant value during the store and restore operations, and alternates between high and low values during normal operation; generating a second clock signal for the slave latch circuit that is a second constant value during the restore operation, the first value during the store operation, and alternates between the high and low values during normal operation. In another aspect, the method further includes coupling the slave latch circuit to the first and second pairs of non-volatile memory cells via first and second transmission gates, wherein the first transmission gate includes a first terminal coupled to a first data node of the slave latch circuit and a second terminal coupled to a first bit line, and the second transmission gate includes a first terminal coupled to a second data node of the slave latch circuit and a second terminal coupled to a second bit line. In a further aspect, the method further includes during the restore and store operations: providing a first row select signal to a row select line coupled to a gate electrode of a pass transistor in each of the memory cells of the first pair of non-volatile memory cells; and providing a second row select signal to a row select line coupled to a gate electrode of a pass transistor in each of the memory cells of the second pair of non-volatile memory cells. In another further aspect, the method further includes during the store operation: coupling source electrodes of N-channel pass transistors in each of the memory cells of the first and second pairs of non-volatile memory cells to a source signal at high voltage. In another aspect, the method further includes detecting operational status of the memory cells of the first and second pairs of non-volatile memory cells and storing indicators of the operational status of the first and second pairs of non-volatile memory cells. In yet another aspect, the method further includes boosting read current for the restore operation with the first and second pairs of non-volatile memory cells coupled in parallel with one another.

In yet another embodiment, a non-volatile flip flop integrated circuit includes a master latch circuit; a slave latch circuit coupled to the master latch circuit; a non-volatile memory array coupled to the slave latch circuit, where the non-volatile memory array includes: a first pair of memory cells coupled to the slave latch circuit; a second pair of memory cells coupled to the slave latch circuit in parallel with the first pair of memory cells, wherein the first and second pair of memory cells are configured to store data from the slave latch circuit, and to restore data to the slave latch circuit. In one aspect of the above yet another embodiment, the integrated circuitry further includes a store/restore circuit coupled between the first and second pairs of memory cells and the slave latch circuit, wherein the store/restore circuit includes: a first transmission gate having a first terminal coupled to the slave latch circuit, a second terminal coupled to a first bit line; a first P-channel transistor including a source electrode coupled to a supply voltage, a drain electrode, and a gate electrode coupled to a complement of a restore signal; a second P-channel transistor including a source electrode coupled to the drain electrode of the first P-channel transistor, a drain electrode coupled to the first bit line, and a gate electrode coupled to a bias signal; a second transmission gate having a first terminal coupled to the slave latch circuit, a second terminal coupled to a second bit line; a third P-channel transistor including a source electrode coupled to the supply voltage, a drain electrode, and a gate electrode coupled to the complement of the restore signal; a fourth P-channel transistor including a source electrode coupled to the drain electrode of the third P-channel transistor, a drain electrode coupled to the second bit line, and a gate electrode coupled to the bias signal. In another aspect, the non-volatile memory array includes a first carbon nanotube resistor including a first terminal coupled to the first bit line and a second terminal coupled to a drain electrode of a first N-channel transistor, the first N-channel transistor further having a source electrode coupled to a source voltage and a gate electrode coupled to a first restore/store signal; a second carbon nanotube resistor including a first terminal coupled to the first bit line and a second terminal coupled to a drain electrode of a second N-channel transistor, the second N-channel transistor further having a source electrode coupled to the source voltage and a gate electrode coupled to a second restore/store signal; a third carbon nanotube resistor including a first terminal coupled to the second bit line and a second terminal coupled to a drain electrode of a third N-channel transistor, the third N-channel transistor further having a source electrode coupled to the source voltage and a gate electrode coupled to the first restore/store signal; a fourth carbon nanotube resistor including a first terminal coupled to the second bit line and a second terminal coupled to a drain electrode of a fourth N-channel transistor, the fourth N-channel transistor further having a source electrode coupled to the source voltage and a gate electrode coupled to the second restore/store signal.

What is claimed is:
1. A non-volatile flip-flop integrated circuit, comprising:
a master latch;
a slave latch coupled to the master latch and configured to store a copy of data in the master latch;
a first pair of non-volatile memory cells coupled to the slave latch;
a second pair of non-volatile memory cell coupled to the slave latch and the first pair of non-volatile memory cells; and
store/restore circuitry, coupled to first and second bit lines between the slave latch and the first and second pairs of non-volatile memory cells, and configured to couple the first and second pairs of memory cells to the slave latch circuit to store data from the slave latch to the first and second pairs of non-volatile memory cells, and to restore data from the first and second pairs of non-volatile memory cells to the slave latch, wherein the store/restore circuitry comprises:
a first transmission gate including a first terminal coupled to a first data node of the slave latch and a second terminal coupled to the first bit line;
a first P-channel transistor including a source electrode coupled to a supply voltage, a drain electrode, and a control gate coupled to a complement of a restore signal;
a second P-channel transistor including a source electrode coupled to the drain electrode of the first P-channel transistor, a drain electrode coupled to the first bit line, and a control gate coupled to a bias signal;
a second transmission gate including a first terminal coupled to a second data node of the slave latch and a second terminal coupled to the second bit line;
a third P-channel transistor including a source electrode coupled to the supply voltage, a drain electrode, and a control gate coupled to a complement of a restore signal;
a fourth P-channel transistor including a source electrode coupled to the drain electrode of the third P-channel transistor, a drain electrode coupled to the second bit line, and a control gate coupled to the bias signal.

2. The integrated circuit of claim 1, further comprising:
a first row select line coupled to a control gate of a pass transistor in each of the first pair of non-volatile memory cells;
a second row select line coupled to a control gate of a pass transistor in each of the second pair of non-volatile memory cells.

3. The integrated circuit of claim 1, wherein the first and second pair of non-volatile memory cells include carbon nanotube elements configured to store the data from the slave latch.

4. The integrated circuit of claim 1, further comprising:
clock circuitry configured to generate first and second clock signals, wherein the first and second clock signals alternate between first and second values during normal operation when the slave latch stores data from the master latch, and
the first clock signal is at a constant first value and the second clock signal is at a constant second value when data from the first or second pair of non-volatile memory cells is restored to the slave latch.

5. A non-volatile flip-flop integrated circuit, comprising:
a master latch;
a slave latch coupled to the master latch and configured to store a copy of data in the master latch;
a first pair of non-volatile memory cells coupled to the slave latch:
a second pair of non-volatile memory cell coupled to the slave latch and the first pair of non-volatile memory cells;
store/restore circuitry, coupled to first and second bit lines between the slave latch and the first and second pairs of non-volatile memory cells, and configured to couple the first and second pairs of memory cells to the slave latch circuit to store data from the slave latch to the first and second pairs of non-volatile memory cells, and to restore data from the first and second pairs of non-volatile memory cells to the slave latch; and
a source circuit coupled to a source electrode of an N-channel pass transistor in each of the first and second pairs of non-volatile memory cells, wherein an output of the source circuit is high when a select signal is asserted, a restore signal is not asserted, and a clock signal is high.

6. The integrated circuit of claim 5, wherein the first and second pairs of non-volatile memory cells are coupled in parallel to one another.

7. The integrated circuit of claim 6, wherein each non-volatile memory cell in the first and second pairs of non-volatile memory cells includes a non-volatile programmable storage element with a first terminal coupled to the first bit line and a second terminal coupled to a drain electrode of the N-channel pass transistor.

8. The integrated circuit of claim 5, further comprising:
a first row select line coupled to a control gate of a pass transistor in each of the first pair of non-volatile memory cells;
a second row select line coupled to a control gate of a pass transistor in each of the second pair of non-volatile memory cells.

9. The integrated circuit of claim 5, wherein the first and second pair of non-volatile memory cells include carbon nanotube elements configured to store the data from the slave latch.

10. The integrated circuit of claim 5, further comprising:
clock circuitry configured to generate first and second clock signals, wherein the first and second clock signals alternate between first and second values during normal operation when the slave latch stores data from the master latch, and
the first clock signal is at a constant first value and the second clock signal is at a constant second value when data from the first or second pair of non-volatile memory cells is restored to the slave latch.

11. A non-volatile flip-flop integrated circuit, comprising:
a master latch;
a slave latch coupled to the master latch and configured to store a copy of data in the master latch;
a first pair of non-volatile memory cells coupled to the slave latch:
a second pair of non-volatile memory cell coupled to the slave latch and the first pair of non-volatile memory cells; and
store/restore circuitry, coupled to first and second bit lines between the slave latch and the first and second pairs of non-volatile memory cells, and configured to couple the first and second pairs of memory cells to the slave latch circuit to store data from the slave latch to the first and second pairs of non-volatile memory cells, and to restore data from the first and second pairs of non-volatile memory cells to the slave latch;
a first row select line coupled to a control gate of a pass transistor in each of the first pair of non-volatile memory cells;
a second row select line coupled to a control gate of a pass transistor in each of the second pair of non-volatile memory cells; and
row select circuitry coupled to the first and second row select lines, the row select circuitry including:
a first set of resistive elements coupled in series between a first supply voltage and a second supply voltage,
a first logic gate including a first input coupled between a first and second of the first set of resistive elements, a second input coupled to a complement of a select signal, and an output coupled to the first row select line;
a second set of resistive elements coupled in series between the first supply voltage and the second supply voltage,
a second logic gate including a first input coupled between a first and second of the second set of resistive elements, a second input coupled to a complement of a select signal, and an output coupled to the second row select line.

12. A non-volatile flip-flop integrated circuit, comprising:
a master latch;
a slave latch coupled to the master latch and configured to store a copy of data in the master latch;
a first pair of non-volatile memory cells coupled to the slave latch;
a second pair of non-volatile memory cell coupled to the slave latch and the first pair of non-volatile memory cells; and
store/restore circuitry, coupled to first and second bit lines between the slave latch and the first and second pairs of non-volatile memory cells, and configured to couple the first and second pairs of memory cells to the slave latch circuit to store data from the slave latch to the first and second pairs of non-volatile memory cells, and to restore data from the first and second pairs of non-volatile memory cells to the slave latch:
a first row select line coupled to a control ate of a pass transistor in each of the first pair of non-volatile memory cells;
a second row select line coupled to a control gate of a pass transistor in each of the second pair of non-volatile memory cells; and
row select circuitry including a first set of resistive elements coupled in series, and a second set of resistive elements coupled in series with opposite polarity as the first set of resistor elements; and
a logic gate including a first input coupled between the first and second sets of resistive elements and an output coupled to the first row select line.

13. A method of operating a slave latch circuit coupled to a master latch and non-volatile memory comprising:
during normal operation:
copying data from the master latch to the slave latch;
during a restore operation:
coupling first and second pairs of non-volatile memory cells to the slave latch circuit,
transferring data from the first and second pairs of non-volatile memory cells to the slave latch circuit, wherein the first and second pairs of non-volatile memory cells are coupled in parallel with one another,
decoupling the first and second pairs of non-volatile memory cells from the slave latch circuit after the data is transferred from the first and second pairs of non-volatile memory cells to the slave latch circuit;
during a store operation:
coupling the first and second pairs of non-volatile memory cells to the slave latch circuit,
transferring data from the slave latch to the first and second pairs of non-volatile memory cells,
decoupling the first and second pairs of non-volatile memory cells from the slave latch circuit after the data is transferred from the latch circuit to the first and second pairs of non-volatile memory cells;
generating a first clock signal for the slave latch circuit that is a first constant value during the store and restore operations, and alternates between high and low values during normal operation; and
generating a second clock signal for the slave latch circuit that is a second constant value during the restore operation, the first value during the store operation, and alternates between the high and low values during normal operation.

14. The method of claim 13, further comprising:
coupling the slave latch circuit to the first and second pairs of non-volatile memory cells via first and second transmission gates, wherein the first transmission gate includes a first terminal coupled to a first data node of the slave latch circuit and a second terminal coupled to a first bit line, and the second transmission gate includes a first terminal coupled to a second data node of the slave latch circuit and a second terminal coupled to a second bit line.

15. The method of claim 14, further comprising:
during the restore and store operations:
providing a first row select signal to a row select line coupled to a gate electrode of a pass transistor in each of the memory cells of the first pair of non-volatile memory cells; and
providing a second row select signal to a row select line coupled to a gate electrode of a pass transistor in each of the memory cells of the second pair of non-volatile memory cells.

16. The method of claim 14, further comprising:
during the store operation:
coupling source electrodes of N-channel pass transistors in each of the memory cells of the first and second pairs of non-volatile memory cells to a source signal at high voltage.

17. The method of claim 13, further comprising:
boosting read current for the restore operation with the first and second pairs of non-volatile memory cells coupled in parallel with one another.

18. A method of operating a slave latch circuit coupled to a master latch and non-volatile memory comprising:
during normal operation:
copying data from the master latch to the slave latch;
during a restore operation:
coupling first and second pairs of non-volatile memory cells to the slave latch circuit,
transferring data from the first and second pairs of non-volatile memory cells to the slave latch circuit, wherein the first and second pairs of non-volatile memory cells are coupled in parallel with one another,
decoupling the first and second pairs of non-volatile memory cells from the slave latch circuit after the data is transferred from the first and second pairs of non-volatile memory cells to the slave latch circuit,
during a store operation:
coupling the first and second pairs of non-volatile memory cells to the slave latch circuit,
transferring data from the slave latch to the first and second pairs of non-volatile memory cells,
decoupling the first and second pairs of non-volatile memory cells from the slave latch circuit after the data is transferred from the latch circuit to the first and second pairs of non-volatile memory cells; and
detecting operational status of the memory cells of the first and second pairs of non-volatile memory cells and storing indicators of the operational status of the first and second pairs of non-volatile memory cells.

19. The method of claim 18, further comprising:
coupling the slave latch circuit to the first and second pairs of non-volatile memory cells via first and second transmission gates, wherein the first transmission gate includes a first terminal coupled to a first data node of the slave latch circuit and a second terminal coupled to a first bit line, and the second transmission gate includes a first terminal coupled to a second data node of the slave latch circuit and a second terminal coupled to a second bit line.

20. The method of claim 19, further comprising:
during the restore and store operations:
providing a first row select signal to a row select line coupled to a gate electrode of a pass transistor in each of the memory cells of the first pair of non-volatile memory cells; and
providing a second row select signal to a row select line coupled to a gate electrode of a pass transistor in each of the memory cells of the second pair of non-volatile memory cells.

21. The method of claim 19, further comprising:
during the store operation:
coupling source electrodes of N-channel pass transistors in each of the memory cells of the first and second pairs of non-volatile memory cells to a source signal at high voltage.

22. The method of claim 18, further comprising:
boosting read current for the restore operation with the first and second pairs of non-volatile memory cells coupled in parallel with one another.

23. A non-volatile flip flop integrated circuit, comprising:
a master latch circuit;
a slave latch circuit coupled to the master latch circuit;
a non-volatile memory array coupled to the slave latch circuit, where the non-volatile memory array includes:
a first pair of memory cells coupled to the slave latch circuit, and
a second pair of memory cells coupled to the slave latch circuit in parallel with the first pair of memory cells, wherein the first and second pair of memory cells are configured to store data from the slave latch circuit, and to restore data to the slave latch circuit;
a store/restore circuit coupled between the first and second pairs of memory cells and the slave latch circuit, wherein the store/restore circuit includes:
a first transmission gate having a first terminal coupled to the slave latch circuit, a second terminal coupled to a first bit line,
a first P-channel transistor including a source electrode coupled to a supply voltage, a drain electrode, and a gate electrode coupled to a complement of a restore signal,
a second P-channel transistor including a source electrode coupled to the drain electrode of the first P-channel transistor, a drain electrode coupled to the first bit line, and a gate electrode coupled to a bias signal,
a second transmission gate having a first terminal coupled to the slave latch circuit, a second terminal coupled to a second bit line,
a third P-channel transistor including a source electrode coupled to the supply voltage, a drain electrode, and a gate electrode coupled to the complement of the restore signal, and
a fourth P-channel transistor including a source electrode coupled to the drain electrode of the third P-channel transistor. a drain electrode coupled to the second bit line, and a gate electrode coupled to the bias signal.

24. The integrated circuit of claim 23, wherein the non-volatile memory array comprises:

a first carbon nanotube resistor including a first terminal coupled to the first bit line and a second terminal coupled to a drain electrode of a first N-channel transistor, the first N-channel transistor further having a source electrode coupled to a source voltage and a gate electrode coupled to a first restore/store signal;

a second carbon nanotube resistor including a first terminal coupled to the first bit line and a second terminal coupled to a drain electrode of a second N-channel transistor, the second N-channel transistor further having a source electrode coupled to the source voltage and a gate electrode coupled to a second restore/store signal;

a third carbon nanotube resistor including a first terminal coupled to the second bit line and a second terminal coupled to a drain electrode of a third N-channel transistor, the third N-channel transistor further having a source electrode coupled to the source voltage and a gate electrode coupled to the first restore/store signal;

a fourth carbon nanotube resistor including a first terminal coupled to the second bit line and a second terminal coupled to a drain electrode of a fourth N-channel transistor, the fourth N-channel transistor further having a source electrode coupled to the source voltage and a gate electrode coupled to the second restore/store signal.

* * * * *